US006555919B1

United States Patent
Tsai et al.

(12) 
(10) Patent No.: US 6,555,919 B1
(45) Date of Patent: Apr. 29, 2003

(54) LOW PROFILE STACK SEMICONDUCTOR PACKAGE

(75) Inventors: Chung-Che Tsai, Taipei (TW); Wei-Heng Shan, Hsinchu (TW)

(73) Assignee: UltraTera Corporation, Taiwan (CN)

( * ) Notice: Subject to any disclaimer, the term of this patent is extended or adjusted under 35 U.S.C. 154(b) by 0 days.

(21) Appl. No.: 10/127,918

(22) Filed: Apr. 23, 2002

(51) Int. Cl.[7] ................................. H01L 23/48
(52) U.S. Cl. ................. 257/777; 257/686; 257/723; 257/784; 257/780; 257/787; 257/738
(58) Field of Search ................. 257/777, 686, 257/723, 784, 780, 787, 738

(56) References Cited

U.S. PATENT DOCUMENTS 6,333,564 B1 * 12/2001 Katoh et al. ............... 257/780

* cited by examiner

Primary Examiner—David L. Talbott
Assistant Examiner—Luan Thai
(74) Attorney, Agent, or Firm—Peter F. Corless; Steven M. Jensen; Edwards & Angell, LLP

(57) ABSTRACT

A low profile stack semiconductor package is proposed, wherein at least two chips having centrally-situated bond pads are stacked on a substrate that is formed with a through opening. A first chip is mounted on the substrate, with bond pads thereof being exposed to the opening. A second chip mounted on the first chip, is formed with a peripherally-situated cushion member, whereby bonding wires are adapted to extend from bond pads of the second chip in a direction parallel to the chip, and reach the cushion member beyond which the bonding wires turn downwardly to be directed toward the substrate, wherein the bonding wires are free of forming wire loops as extending above the second chip. By the above structure, the bonding wires would be firmly held in position to be free of contact or short circuit with the second chip, and overall package profile can be significantly miniaturized.

30 Claims, 4 Drawing Sheets

LOW PROFILE STACK SEMICONDUCTOR PACKAGE

FIELD OF THE INVENTION

The present invention relates to semiconductor packages, and more particularly, to a multi-chip semiconductor package mounted with stacked chips therein.

BACKGROUND OF THE INVENTION

Stack semiconductor packages are advanced packaging technology, which is characterized by stacking a plurality of chips in a single package structure, so as to desirably multiply operational performances and memory capacity for semiconductor packages.

Conventional chip-stack structures are exemplified with reference to FIGS. 5A and 5B. As shown in FIG. 5A, two chips 10, 11 are stacked on a substrate 12, and electrically connected to the substrate 12 by means of bonding wires 13, 14 respectively. Such a structure is limited to a relatively smaller size of the overlying chip 11 with respect to the underlying chip 10, whereby forming of the bonding wires 13 would not be interfered by stacked arrangement of the chips 10, 11. A solution to chip-size limitation, as shown in FIG. 5B, is to apply an adhesive 15 between the two chips 10, 11 in a manner that, the adhesive 15 is sufficiently dimensioned in thickness for allowing the overlying chip 11 to be mounted on the underlying chip 10 without coming into contact with the bonding wires 13, such that the overlying chip 11 can be sized equally or even larger in surface area than the underlying chip 10.

However, in the above chip-stack structures, the bonding wires 13, 14 may be easily subject to wire sagging or sweep due to strong mold-flow impact of a molding compound or resin for forming a chip-enclosed encapsulant (not shown) during a molding process. Wire sagging or sweep would cause electrical contact or short circuit between adjacent bonding wires or between bonding wires and chips, thereby undesirably damaging electrical quality and yield for fabricated products.

Moreover, as the different sets of bonding wires 13, 14 laterally extend to reach different area on the substrate 12 outside the underlying chip 10, occupied area on the substrate 12 is therefore hardly reduced. Further, wire loops of the bonding wires 14 bonded to the overlying chip 11 are essentially adapted in elevation to allow the wire lateral extension to reach farther than the bonding wires 13 bonded to the underlying chip 10; this makes overall structural thickness or height hardly reduced in consideration of loop height of the bonding wires 14.

In order to solve the wire sweep or short circuit problems, a plurality of sweep-prevention mechanisms have been disclosed in the art, to name a few herein as follows with reference to FIGS. 6 and 7.

FIGS. 6A and 6B illustrate pre-encapsulation of bonding wires in a conventional chip assembly structure. As shown in FIG. 6A, bonding wires 20 for electrically connecting a chip 21 to a substrate 22 are strictly attached at original bonding positions by a resin compound 23 prior to forming of an encapsulant 24. Therefore, during a molding process for fabricating the encapsulant 24, the bonding wires 20 held in position within the resin compound 23 would not be subjected to wire sagging or sweep by mold-flow impact. Alternatively, as shown in FIG. 6B, a resin compound 23 is used to partly encapsulate the bonding wires 20, and to hold the bonding wires 20 in position without being sagged or swept during molding and without coming into contact with adjacent wires (not shown) or edge of a chip 21, thereby preventing short circuit from occurrence in a perfect manner.

FIGS. 7A and 7B illustrate forming of a dam structure in a conventional chip assembly structure. As shown in FIG. 7A, a dam structure 30 is formed on a substrate 31, whereby bonding wires 32 for electrically connecting the chip 33 to the substrate 31, are supported by the dam structure 30 in a manner as not to come into contact with the chip 33, so that wire-to-chip short circuit can be effectively prevented. Alternatively, as shown in FIG. 7B, the dam structure 30 can be formed on the chip 33, and provides the same improvement as to space the bonding wires 32 apart from the chip 33, without causing short circuit between the bonding wires 32 and the chip 33.

However, the above sweep-prevention mechanisms can only solve the wire sweep or shirt circuit problems for the conventional chip-stack structures, without achieving any improvement in profile reduction for the chip-stack structures. And, the above conventional chip-stack structures are primarily used to accommodate chips with peripherally-situated bond pads where bonding wires are bonded, but not suitably applied for stacking chips with centrally-situated bond pads such as DRAM (dynamic random access memory) chips.

Therefore, it is highly desired to develop a semiconductor package for stacking chips with centrally-situated bond pads, by which package profile can be desirably miniaturized as well as electrical quality can be firmly assured.

SUMMARY OF THE INVENTION

An objective of the present invention is to provide a low profile stack semiconductor package for use to stack chips having centrally-situated bond pads, such as DRAM (dynamic random access memory) chips.

Another objective of the invention is to provide a low profile stack semiconductor package, which effectively reduces occupied area on a substrate and overall thickness of the package structure, in favor of profile miniaturization for the semiconductor package.

A further objective of the invention is to provide a low profile stack semiconductor package, which significantly prevents undesirable contact or short circuit between bonding wires and a chip.

A further objective of the invention is to provide a low profile stack semiconductor package, which allows bonding wires to be firmly held in position, without causing wire sagging or sweep.

A further objective of the invention is to provide a low profile stack semiconductor package, which can desirably reduce pitch spacing between adjacent bonding wires, allowing the semiconductor package to be suitably applied to high-level products with fine-pitch structural arrangement.

In accordance with the above and other objectives, the present invention proposes a low profile stack semiconductor package, comprising: a substrate having an opening penetrating therethrough; a first chip formed with a plurality of centrally-situated bond pads on an active surface thereof, and mounted on the substrate in a manner as to expose the bond pads to the opening of the substrate; a second chip formed with a plurality of centrally-situated bond pads on an active surface thereof, and mounted on the first chip in a manner that, the active surface of the second chip is opposed to the active surface of the first chip, wherein a cushion member is formed at peripheral area on the active surface of the second chip, and extends outwardly to at least reach a peripheral edge of the active surface; a plurality of first bonding wires for electrically connecting the bond pads of the first chip through the opening to the substrate; a plurality of second bonding wires for electrically connecting the bond pads of the second chip to the substrate in a manner that, the second bonding wires extend from the bond pads in a direction substantially parallel to the active surface of the second chip, and are adapted to be in contact with the cushion member, beyond which the second bonding wires turn to be directed toward the substrate; an encapsulant for encapsulating the first and second chips, and the first and second bonding wires; and a plurality of solder balls implanted on the substrate and exposed to outside of the encapsulant, for electrically connecting the first and second chips to an external device.

The above semiconductor package characterized by forming a cushion member and parallel extension of second bonding wires, would provide significant benefits. First, the second bonding wires extending in parallel to the second chip and free of forming wire loops, help reduce overall thickness of the semiconductor package. Moreover, the cushion member interposed between the second bonding wires and the second chip, effectively prevents undesirable contact or short circuit between the second bonding wires and the second chip, such that electrical quality of the semiconductor package can be firmly assured. Further, in free concern of wire-to-chip contact, the second bonding wires can turn downwardly by a steep angle beyond the cushion member, and steeply extend to reach the substrate; this thereby significantly diminishes occupied area on the substrate, in favor of profile miniaturization for the semiconductor package.

The cushion member is preferably made of an elastic or semi-cured insulating material, whereby the second bonding wires in contact with the cushion member would be each partly embedded in the cushion member. This allows the second bonding wires to be firmly held in position and properly spaced apart from each other on the cushion member, without causing wire sagging or sweep that leads to short circuit or adversely damages electrical connection of the second bonding wires, thereby improving quality and yield of fabrication semiconductor packages. As such, the second bonding wires can be more densely or closely arranged in a manner as to reduce pitch spacing between adjacent bonding wires, making the semiconductor package suitably applied to high-level products with fine-pitch structural arrangement.

In other embodiments, the peripherally-situated cushion member is adapted to further extend outwardly beyond the peripheral edge of the active surface of the second chip, or even extend downwardly to entirely cover an edge corner at the active surface and to reach an edge side of the second chip. By this arrangement, the second bonding wires for electrically connecting the second chip to the substrate, can be more firmly assured to be free of undesirable contact with the second chip, without causing short circuit between the second bonding wires and the second chip. Further in view thereof, the second bonding wires turning downwardly beyond the cushion member, can be adapted to more steeply extend to reach the substrate, making occupied area on the substrates as well as overall profile of the semiconductor package both desirably reduced.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a low profile stack semiconductor package proposed in the present invention are described in more detail as follows with reference to FIGS. 1 to 4. These drawings are made in simplicity for exemplification purpose, and used for depicting structural features or characteristics of the semiconductor package; it should be understood that, the semiconductor package of the invention is more complexly structured in practical fabrication.

First Preferred Embodiment

Figure 1:
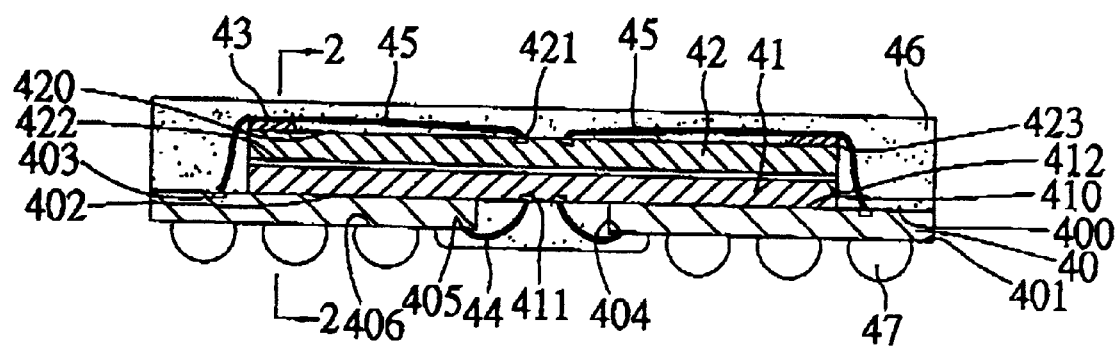
FIG. 1 is a cross-sectional view of a first embodiment of a semiconductor package of the invention.

As shown in FIG. 1, the low profile stack semiconductor package of the invention comprises a substrate 40; a first chip 41 mounted on the substrate 40; a second chip 42 mounted on the first chip 41; a plurality of bonding wires 44, 45 for electrically connecting the first and second chips 41, 42 respectively to the substrate 40; an encapsulator 46 for encapsulating the first and second chips 41, 42 and the bonding wires 44, 45; and a plurality of solder balls 47 for electrically connecting the semiconductor package to an external device.

A substrate 40 has an upper surface 400 and a lower surface 401 opposed to the upper surface 400, wherein the upper surface 400 is defined with a chip attach area 402 and an upper wire bonding area 403 surrounding the chip attach area 402. An opening 404 is formed approximately at a central position of the chip attach area 402, and adapted to penetrate through the upper and lower surfaces 400, 401 of the substrate 40. And, the lower surface 401 of the substrate 40 is defined with a lower wire bonding area 405 around the opening 404, and a ball attach area 406 surrounding the lower wire bonding area 405.

A first chip 41 has an active surface 410 formed with a plurality of centrally-situated bond pads 411 thereon, and a non-active surface 412 opposed to the active surface 410. The first chip 41 is mounted on the upper surface 400 of the substrate 40 in a manner that, the active surface 410 of the first chip 41 is attached to the chip attach area 402 of the upper surface 400, allowing the bond pads 411 centrally situated on the active surface 410 to be exposed to the opening 404 of the substrate 40, wherein the opening 404 is sufficiently dimensioned for completely receiving the bond pads 411 of the first chip 41 therein. Such a first chip 41 provided with centrally-situated bond pads 411 can be a DRAM (dynamic random access memory) chip.

A second chip 42 has an active surface 420 formed with a plurality of centrally-situated bond pads 421 thereon, and a non-active surface 422 opposed to the active surface 420. The second chip 42 is mounted on the first chip 41 in a manner that, the non-active surface 422 of the second chip 42 is attached to the non-active surface 412 of the first chip 41. A cushion member 43 is formed at peripheral area on the active surface 420 of the second chip 42, and extends outwardly to reach a peripheral edge 423 of the active surface 420. The cushion member 43 is made of an insulating material that is preferably elastic such as elastomer, or semi-cured.

A plurality of first bonding wires 44 are formed to extend from the bond pads 411 of the first chip 41 through the opening 404 to reach the lower wire bonding area 405 on the lower surface 401 of the substrate 40, allowing the first chip 41 to be electrically connected to the substrate 40 by the first bonding wires 44. With the opening 404 being provided for accommodating the first bonding wires 44, wire loops and length of the first bonding wires 44 can be significantly shortened and reduced for efficiently coupling the bond pads 411 to the lower wire bonding area 405, thereby assuring quality of electrical connection between the first chip 41 and the substrate 40; this is a characteristic advantage for a window-type semiconductor package having an opening formed through a substrate therein.

A plurality of second bonding wires 45 are formed to electrically connect the second chip 42 to the upper surface 400 of the substrate 40. The second bonding wires 45 extend from the centrally-situated bond pads 421 of the second chip 42 to be in a direction substantially parallel to the active surface 420 of the second chip 42, until reaching the cushion member 43 that is peripherally situated on the active surface 420, wherein the parallel-extending second bonding wires 45 are free of forming wire loops as being arranged above the active surface 420 of the second chip 42. The second bonding wires 45 are adapted to be in contact with the cushion member 43 at least at positions corresponding to the peripheral edge 423 of the active surface 420 in a manner that, the cushion member 43 is interposed between the second bonding wires 45 and the second chip 42, allowing the second bonding wires 45 to be free of contact with the second chip 42 except the bond pads 421. Continuously, the second bonding wires 45 turn downwardly beyond the cushion member 43 to be directed toward the upper surface 400 of the substrate 40, and keep extending to reach the upper wire bonding area 403 on the upper surface 400; this thereby allows the second chip 42 to be electrically connected to the substrate 40 by the second bonding wires 45.

An encapsulant 46 is formed of a molding compound such as epoxy resin by performing a molding process. The encapsulant 46 is used for hermetically encapsulating the first and second chips 41, 42, and the first and second bonding wires 44, 45, so as to isolate and protect internal components of the semiconductor package from external impact and contaminant.

Finally, a plurality of solder balls 47 are implanted at the ball attach area 406 on the lower surface 401 of the substrate 40. The solder balls 47 serve as I/O (input/output) ports of the semiconductor package, for electrically connecting the first and second chips 41, 42 to an external device such as a printed circuit board (PCB, not shown).

The above structural arrangement provides significant benefits. With parallel extension of the second bonding wires 45 free of forming wire loops, combined thickness of the first and second chips 41, 42 and the second bonding wires 45 is considerably similar to combined thickness of purely the stacked chips 41, 42, thereby effectively reducing overall thickness of the semiconductor package. By forming the cushion member 43 for preventing undesirably contact between the second bonding wires 45 and the second chip 42, wire-to-chip short circuit can be eliminated from occurrence, for firmly assuring electrical quality of the semiconductor package. Further in free concern of wire-to-chip contact, the second bonding wires 45 can turn downwardly by a steep angle beyond the cushion member 43 and extend to reach the upper surface 400 of the substrate 40. By such steep wire arrangement, the upper wire bonding area 403 on the upper surface 400 for accommodating the second bonding wires 45 can be correspondingly reduced, thereby making occupied area on the substrate 40 significantly diminished, which helps effectively miniaturize overall profile of the semiconductor package.

Figure 2:
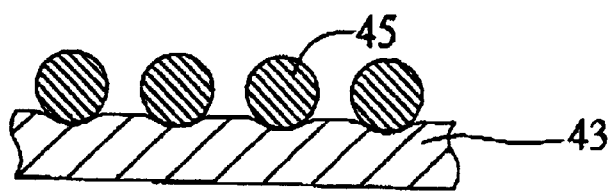
FIG. 2 is a cross-sectional view showing arrangement between bonding wires and a cushion member in the semiconductor package of FIG. 1 by cutting along a line 2—2.

Moreover, as shown in FIG. 2, since the cushion member 43 is preferably made of an elastic or semi-cured insulating material, the second bonding wires 45 in contact with the cushion member 43 would be each partly embedded in the cushion member 43. This allows the second bonding wires 45 to be firmly held in position and properly spaced apart from each other on the cushion member 43, without causing wire sagging or sweep that leads to short circuit or adversely damages electrical connection of the second bonding wires 45, thereby improving quality and yield of fabricated semiconductor packages. As such, the second bonding wires 45 can be more densely or closely arranged in a manner as to reduce pitch spacing between adjacent bonding wires, making the semiconductor package suitably applied to high-level products with fine-pitch structural arrangement.

Second Preferred Embodiment

Figure 3:
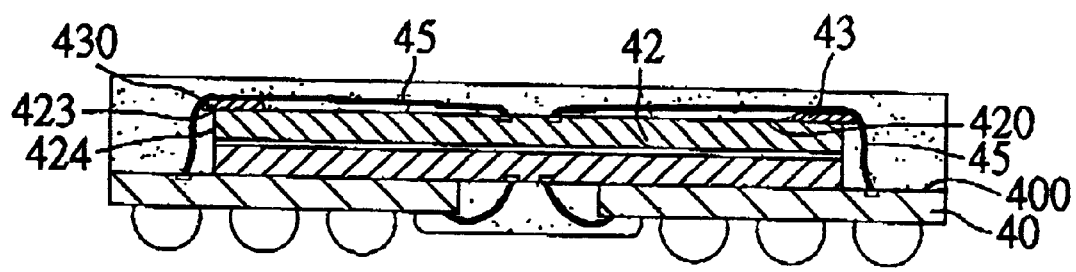
FIG. 3 is a cross-sectional view of a second embodiment of the semiconductor package of the invention.

FIG. 3 illustrates a second embodiment of the semiconductor package of the invention. The second embodiment is mostly the same in structure as the first embodiment, except that a cushion member 43 peripherally situated on an active surface 420 of a second chip 42 extends outwardly beyond a peripheral edge 423 of the active surface 420. This allows a portion 430 of the cushion member 43 to protrude beyond an edge side 424 of the second chip 42. A plurality of second bonding wires 45 for electrically connecting the second chip 45 to a substrate 40, are adapted to be in contact with at least the protruding portion 430 of the cushion member 43, beyond which the second bonding wires 45 turn downwardly to be directed toward an upper surface 400 of the substrate 40. With provision of the protruding portion 430, the second bonding wires 45 can be further assured to be free of undesirable contact with the second chip 42 by the cushion member 43, without causing short circuit between the second bonding wires 45 and the second chip 42. By virtue thereof, the second bonding wires 45 turning downwardly beyond the cushion member 43, can be adapted to more steeply extend to reach the substrate 40, making occupied area on the substrate 40 as well as overall profile of the semiconductor package both desirably reduced.

Third Preferred Embodiment

Figure 4:
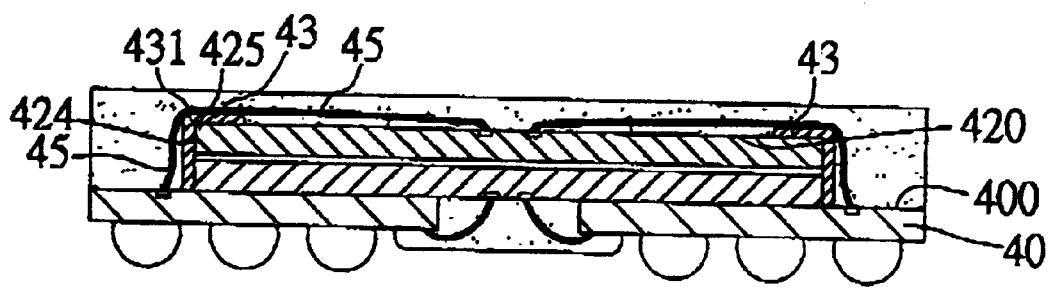
FIG. 4 is a cross-sectional view of a third embodiment of the semiconductor package of the invention.
Figure 5A:
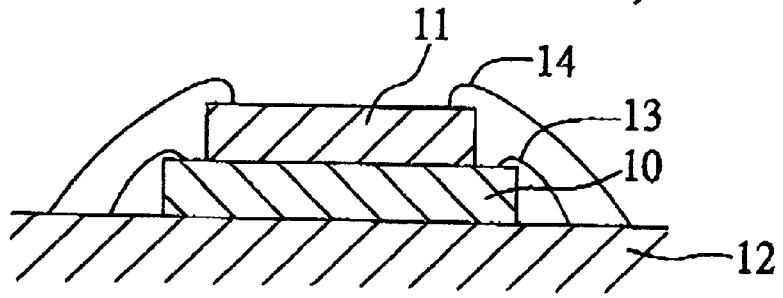
FIGS. 5A and 5B (PRIOR ART) are cross-sectional views of conventional chip-stack structures.
Figure 5B:
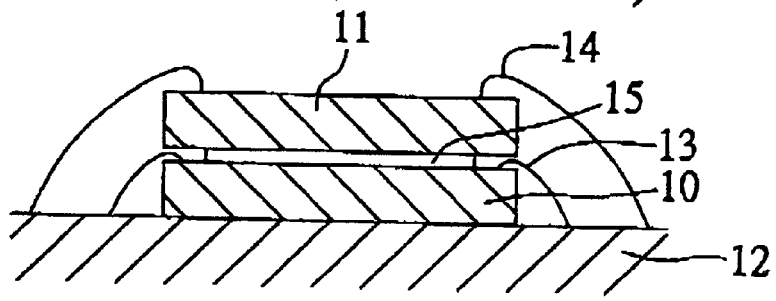
Figure 6A:
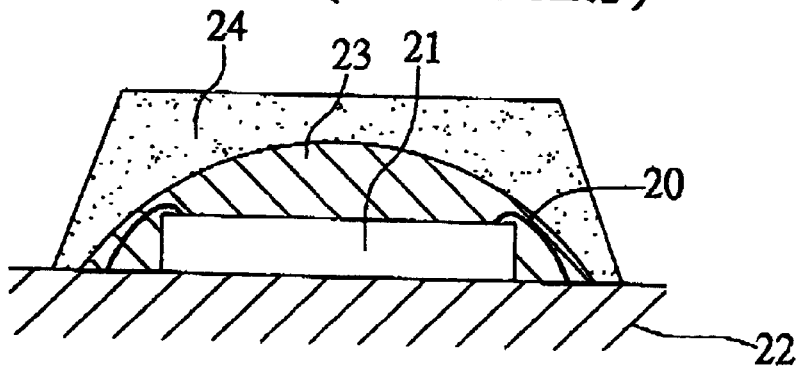
FIGS. 6A and 6B (PRIOR ART) are cross-sectional views respectively showing pre-encapsulation of bonding wires in a conventional chip assembly structure.
Figure 6B:
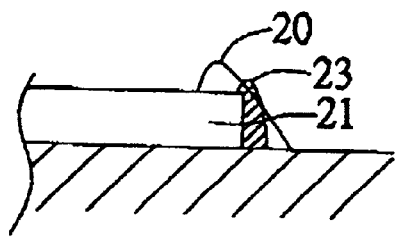
Figure 7A:
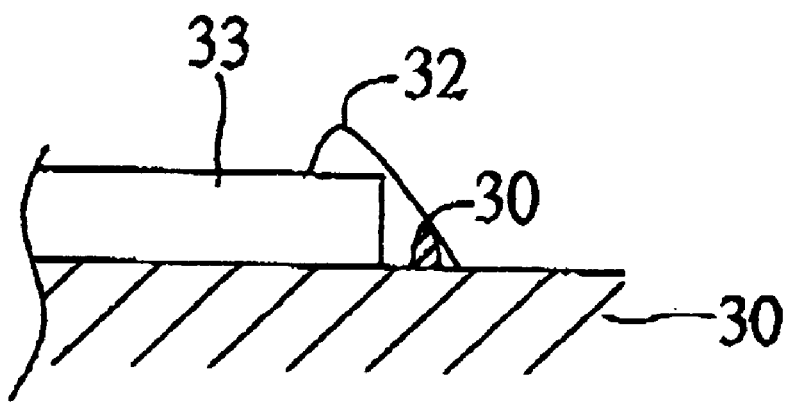
FIGS. 7A and 7B (PRIOR ART) are cross-sectional views respectively showing forming of a dam structure in a conventional chip assembly structure.
Figure 7B:
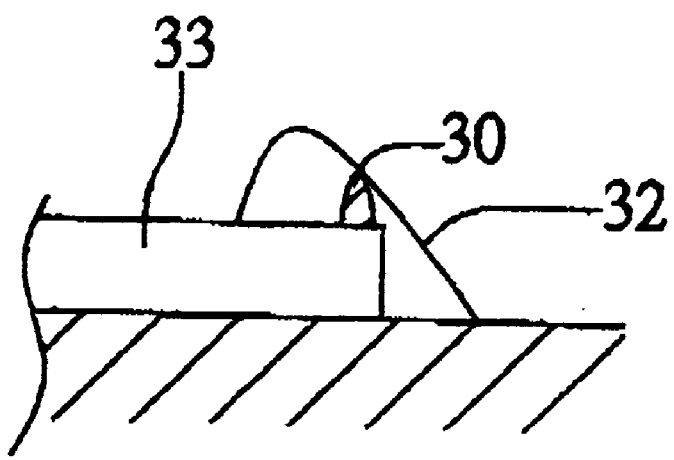

FIG. 4 illustrates a third embodiment of the semiconductor package of the invention. The third embodiment is mostly the same in structure as the second embodiment, except that a cushion member 43 peripherally situated on an active surface 420 of a second chip 42 extends outwardly and downwardly to entirely cover an edge corner 425 at the active surface 420 and to reach an edge side 424 of the second chip 42. This allows an edge corner 431 of the cushion member 43 is situated outwardly in elevation above the edge corner 425 of the second chip 42. A plurality of second bonding wires 45 for electrically connecting the second chip 42 to a substrate 40, are adapted to be in contact with at least the edge corner 431 of the cushion member 43, beyond which the second bonding wires 45 turn downwardly to be directed toward an upper surface 400 of the substrate 40. As the edge corner 425 and edge side 424 of the second chip 42 are encapsulated by the cushion member 43, the second bonding wires 45 would be the most effectively assured to be free of undesirable contact with the second chip 42, without causing short circuit between the second bonding wires 45 and the second chip 42. By virtue thereof, the second bonding wires 45 turning downwardly beyond the cushion member 43 can be adapted to even more steeply extend to reach the substrate 40, making occupied area on the substrate 40 significantly reduced in favor of profile miniaturization for the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A low profile stack semiconductor package, comprising:
    a substrate having an upper surface and a lower surface opposed to the upper surface, wherein an opening is formed to penetrate through the upper and lower surfaces of the substrate;
    a first chip having an active surface formed with a plurality of centrally-situated bond pads thereon, and a non-active surface opposed to the active surface, wherein the active surface of the first chip is mounted on the upper surface of the substrate in a manner that, the centrally-situated bond pads are exposed to the opening of the substrate;
    a second chip having an active surface formed with a plurality of centrally-situated bond pads thereon, and a non-active surface opposed to the active surface, wherein a cushion member is formed at peripheral area on the active surface, and extends outwardly to at least reach a peripheral edge of the active surface, and wherein the non-active surface of the second chip is mounted on the non-active surface of the first chip;
    a plurality of first bonding wires for electrically connecting the bond pads of the first chip to the lower surface of the substrate;
    a plurality of second bonding wires for electrically connecting the bond pads of the second chip to the upper surface of the substrate in a manner that, the second bonding wires are adapted to be in contact with the cushion member at least at positions corresponding to the peripheral edge of the active surface of the second chip, wherein the second bonding wires turn beyond the cushion member to be directed toward the upper surface of the substrate;
    an encapsulant for encapsulating the first and second chips, and the first and second bonding wires; and
    a plurality of solder balls implanted on the lower surface of the substrate, for electrically connecting the first and second chips to an external device.

2. The semiconductor package of claim 1, wherein the opening of the substrate is dimensioned in a manner as to completely receive the bond pads of the first chip therein.

3. The semiconductor package of claim 1, wherein the first and second chips are each a DRAM (dynamic random access memory) chip.

4. The semiconductor package of claim 1, wherein the cushion member is made of an insulating material.

5. The semiconductor package of claim 4, wherein the insulating material is elastic.

6. The semiconductor package of claim 5, wherein the second bonding wires in contact with the cushion member are each partly embedded in the cushion member, and held in position by the cushion member.

7. The semiconductor package of claim 4, wherein the insulating material is semi-cured during forming of the second bonding wires.

8. The semiconductor package of claim 7, wherein the second bonding wires in contact with the cushion member are each partly embedded in the cushion member, and held in position by the cushion member.

9. The semiconductor package of claim 1, wherein the second bonding wires extend from the bond pads of the second chip to be in a direction substantially parallel to the active surface of the second chip, allowing the second bonding wires to be free of forming wire loops as extending above the active surface of the second chip.

10. The semiconductor package of claim 1, wherein the cushion member is interposed between the second bonding wires and the second chip, allowing the second bonding wires to be free of contact with the second chip except the bond pads.

11. A low profile stack semiconductor package, comprising:
    a substrate having an upper surface and a lower surface opposed to the upper surface, wherein an opening is formed to penetrate through the upper and lower surfaces of the substrate;
    a first chip having an active surface formed with a plurality of centrally-situated bond pads thereon, and a non-active surface opposed to the active surface, wherein the active surface of the first chip is mounted on the upper surface of the substrate in a manner that, the centrally-situated bond pads are exposed to the opening of the substrate;
    a second chip having an active surface formed with a plurality of centrally-situated bond pads thereon, and a non-active surface opposed to the active surface, wherein a cushion member is formed at peripheral area on the active surface, and extends outwardly beyond a peripheral edge of the active surface, allowing a portion of the cushion member to protrude beyond an edge side of the second chip, and wherein the non-active surface of the second chip is mounted on the non-active surface of the first chip;
    a plurality of first bonding wires for electrically connecting the bond pads of the first chip to the lower surface of the substrate;
    a plurality of second bonding wires for electrically connecting the bond pads of the second chip to the upper surface of the substrate in a manner that, the second bonding wires are adapted to be in contact with at least the protruding portion of the cushion member, beyond which the second bonding wires turn to be directed toward the upper surface of the substrate;
    an encapsulant for encapsulating the first and second chips, and the first and second bonding wires; and
    a plurality of solder balls implanted on the lower surface of the substrate, for electrically connecting the first and second chips to an external device.

12. The semiconductor package of claim 11, wherein the opening of the substrate is dimensioned in a manner as to completely receive the bond pads of the first chip therein.

13. The semiconductor package of claim 11, wherein the first and second chips are each a DRAM (dynamic random access memory) chip.

14. The semiconductor package of claim 11, wherein the cushion member is made of an insulating material.

15. The semiconductor package of claim 14, wherein the insulating material is elastic.

16. The semiconductor package of claim 15, wherein the second bonding wires in contact with the cushion member are each partly embedded in the cushion member, and held in position by the cushion member.

17. The semiconductor package of claim 14, wherein the insulating material is semi-cured during forming of the second bonding wires.

18. The semiconductor package of claim 17, wherein the second bonding wires in contact with the cushion member are each partly embedded in the cushion member, and held in position by the cushion member.

19. The semiconductor package of claim 11, wherein the second bonding wires extend from the bond pads of the second chip to be in a direction substantially parallel to the active surface of the second chip, allowing the second bonding wires to be free of forming wire loops as extending above the active surface of the second chip.

20. The semiconductor package of claim 11, wherein the cushion member is interposed between the second bonding wires and the second chip, allowing the second bonding wires to be free of contact with the second chip except the bond pads.

21. A low profile stack semiconductor package, comprising:

a substrate having an upper surface and a lower surface opposed to the upper surface, wherein an opening is formed to penetrate through the upper and lower surfaces of the substrate;

a first chip having an active surface formed with a plurality of centrally-situated bond pads thereon, and a non-active surface opposed to the active surface, wherein the active surface of the first chip is mounted on the upper surface of the substrate in a manner that, the centrally-situated bond pads are exposed to the opening of the substrate;

a second chip having an active surface formed with a plurality of centrally-situated bond pads thereon, and a non-active surface opposed to the active surface, wherein a cushion member is formed at peripheral area on the active surface, and extends outwardly and downwardly to entirely cover an edge corner at the active surface and to reach an edge side of the second chip, in a manner that an edge corner of the cushion member is situated outwardly in elevation above the edge corner of the second chip, and wherein the non-active surface of the second chip is mounted on the non-active surface of the first chip;

a plurality of first bonding wires for electrically connecting the bond pads of the first chip to the lower surface of the substrate;

a plurality of second bonding wires for electrically connecting the bond pads of the second chip to the upper surface of the substrate in a manner that, the second bonding wires are adapted to be in contact with at least the edge corner of the cushion member, beyond which the second bonding wires turn to be directed toward the upper surface of the substrate;

an encapsulant for encapsulating the first and second chips, and the first and second bonding wires; and a plurality of solder balls implanted on the lower surface of the substrate, for electrically connecting the first and second chips to an external device.

22. The semiconductor package of claim 21, wherein the opening of the substrate is dimensioned in a manner as to completely receive the bond pads of the first chip therein.

23. The semiconductor package of claim 21, wherein the first and second chips are each a DRAM (dynamic random access memory) chip.

24. The semiconductor package of claim 21, wherein the cushion member is made of an insulating material.

25. The semiconductor package of claim 24, wherein the insulating material is elastic.

26. The semiconductor package of claim 25, wherein the second bonding wires in contact with the cushion member are each partly embedded in the cushion member, and held in position by the cushion member.

27. The semiconductor package of claim 24, wherein the insulating material is semi-cured during forming of the second bonding wires.

28. The semiconductor package of claim 27, wherein the second bonding wires in contact with the cushion member are each partly embedded in the cushion member, and held in position by the cushion member.

29. The semiconductor package of claim 21, wherein the second bonding wires extend from the bond pads of the second chip to be in a direction substantially parallel to the active surface of the second chip, allowing the second bonding wires to be free of forming wire loops as extending above the active surface of the second chip.

30. The semiconductor package of claim 21, wherein the cushion member is interposed between the second bonding wires and the second chip, allowing the second bonding wires to be free of contact with the second chip except the bond pads.

* * * * *